United States Patent
Lin et al.

(10) Patent No.: US 10,877,380 B1
(45) Date of Patent: Dec. 29, 2020

(54) USING INVERSE LITHOGRAPHY TECHNOLOGY IN A METHOD OF MASK DATA PREPARATION FOR GENERATING INTEGRATED CIRCUIT

(71) Applicant: TAIWAN SEMICONDUCTOR MANUFACTURING COMPANY LTD., Hsinchu (TW)

(72) Inventors: Yihung Lin, Hsinchu County (TW);
Yi-Feng Lu, Hsinchu (TW);
Huang-Ming Wu, Hsinchu (TW);
Chi-Ta Lu, Yilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/573,772

(22) Filed: Sep. 17, 2019

(51) Int. Cl.
*G03F 7/00* (2006.01)
*G03F 7/20* (2006.01)
*G06F 30/392* (2020.01)
*G06F 30/337* (2020.01)
*G06F 30/398* (2020.01)

(52) U.S. Cl.
CPC ........ *G03F 7/70441* (2013.01); *G06F 30/392* (2020.01); *G06F 30/337* (2020.01); *G06F 30/398* (2020.01)

(58) Field of Classification Search
CPC .. G03F 7/70441; G06F 30/392; G06F 30/337; G06F 30/398
See application file for complete search history.

(56) References Cited

U.S. PATENT DOCUMENTS

| | | | |
|---|---|---|---|
| 8,370,773 B2 * | 2/2013 | Lucas | G03F 1/36 716/52 |
| 8,458,631 B2 | 6/2013 | Lu et al. | |
| 9,009,633 B2 * | 4/2015 | Wu | G03F 1/36 716/53 |
| 9,547,892 B2 * | 1/2017 | Shi | G06T 7/001 |
| 2011/0243424 A1 * | 10/2011 | Wu | G03F 7/7065 382/144 |
| 2019/0146455 A1 * | 5/2019 | Beylkin | G03F 1/36 700/97 |
| 2020/0133115 A1 * | 4/2020 | Tien | G03F 1/36 |
| 2020/0174380 A1 * | 6/2020 | Huang | G06F 30/398 |

* cited by examiner

*Primary Examiner* — Naum Levin
(74) *Attorney, Agent, or Firm* — WPAT, P.C., Intellectual Property Attorneys; Anthony King

(57) ABSTRACT

A method of generating an integrated circuit includes: receiving, by a processor, a first IC design layout; replacing, by the processor, a specific region in the first IC design layout with a first difference region; performing, by the processor, an inverse lithography technology process upon a junction region between the first difference region and the first IC design layout to generate a mask data; and causing the IC to be fabricated according to the mask data.

20 Claims, 10 Drawing Sheets

USING INVERSE LITHOGRAPHY TECHNOLOGY IN A METHOD OF MASK DATA PREPARATION FOR GENERATING INTEGRATED CIRCUIT

BACKGROUND

In semiconductor manufacturing technology, layouts of circuit designs or structures are typically designed and stored in one or more data files. The data files are then provided to a writer, which is used to convert the data file to an image on a substrate, such as a mask or a semiconductor wafer. In advanced technology node, layouts are becoming increasingly complex. This can be a result of various items, including a reduced critical-dimension (CD) for the images, larger image size, and more intricate patterns. This leads to a longer data preparation cycle as node size decreases and the size of the corresponding data file(s) increases. Therefore, there is a need for providing a method to reduce the cycle time of data preparation during integrated circuit (IC) manufacturing flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
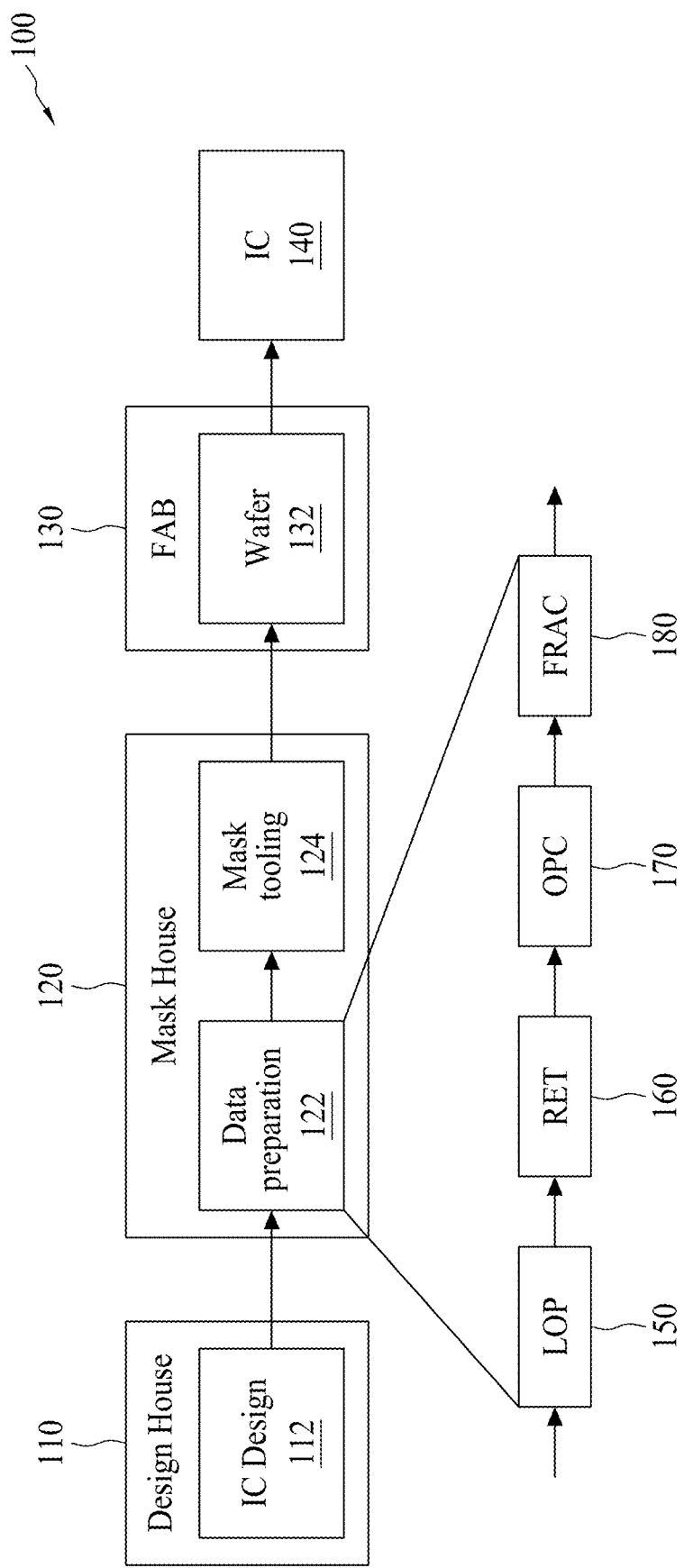
FIG. 1 is a simplified block diagram illustrating an embodiment of an integrated circuit manufacturing system 100 and an IC manufacturing flow associated with an IC manufacturing system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified block diagram illustrating an embodiment of an integrated circuit (IC) manufacturing system 100 and an IC manufacturing flow associated with the IC manufacturing system 100. The IC manufacturing system 100 comprises a plurality of entities, such as a design house 110, a mask house 120, and an IC manufacturer 130, that interact with one another in the design, development, and manufacturing cycles and/or services related to manufacturing an IC device 140. The plurality of entities may be connected by a communications network, which may be a single network or a variety of different networks, such as an intranet and the Internet, and may include wired and/or wireless communication channels. Each entity may interact with other entities and may provide services to and/or receive services from the other entities. The design house 110, mask house 120, and IC manufacturer 130 may be a single entity or separate entities.

For example, when an IC is to be manufactured, a tape-out process is performed. The tape-out process may include a floor planning process in which the various structures making up the IC are provided in a design layout. The process may include generating an electronic file of the design layout in a GDS format. The design layout GDS file is checked by a design rule check (DRC) tool to ensure the design layout complies with various design rules such as a minimum density rule. It is understood that other types of file formats may be also be used in this example. The process continues with an assembly process. The circuit design may be partitioned into various blocks, each block performing a specific function. Accordingly, the various blocks are assembled together and the entire design layout is ready for photomask (or mask) processing.

During the design stage, the design house 110 generates an IC design layout 112. The IC design layout 112 includes various geometrical patterns designed for an IC product, based on a specification of the IC product to be manufactured. The geometrical patterns correspond to patterns of metal, oxide, or semiconductor layers that make up the various components of the IC device 140 to be fabricated. The various layers combine to form various IC features. For example, a portion of the IC design layout 112 may include various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 110 implements a proper design procedure to form the IC design layout 112. The design procedure may include logic design, physical design, and/or place and route. The IC design layout 112 is presented in one or more data files having information of the geometrical patterns. For example, the IC design layout 112 can be expressed in a GDSII file format.

During the E-beam operation (EBO), the mask house 120 uses the IC design layout 112 to manufacture one or more masks (or photomask) to be used for fabricating the various layers of the IC product according to the IC design layout 112. The mask house 120 performs mask data preparation 122, where the IC design layout 112 is translated into a form that can be physically written by a mask writer, and mask tooling 124, where the design layout prepared by the mask data preparation 122 is modified to comply with a particular mask writer and/or mask manufacturer. In the present embodiment, the mask data preparation 122 and mask tooling 124 are illustrated as separate elements, however, the mask data preparation 122 and mask tooling 124 can be collectively referred to as mask data preparation, which can further include mask fabrication. A number of mask images may be generated based on the finished design layout. The number of mask images will vary depending on the complexity of the design layout. The process is now in a tape-out stage which represents when the design layout (or database) is ready for the chip manufacture.

The mask data preparation 122 includes a logic operation (LOP) 150, a retarget process (RET) 160, an optical proximity correction (OPC) 170, and a fracturing process (FRAC) 180.

The LOP 150 is performed on the IC design layout 112 to modify the IC design layout 112 according to manufacturing rules. For example, the conversion process may be implemented by software in LOP 150. Various manufacturer modules convert manufacturing constraints into a set of rules that the IC design layout 112 has to meet. If the IC design layout 112 does not meet this set of rules, the IC design layout 112 will be modified accordingly until the modified IC design layout meets these rules. Such modification is implemented by the logic operation 150.

The RET 160 and OPC 170 are resolution enhancement techniques. The RET 160 (or rule-based OPC) can modify the IC design layout 112 to compensate for limitations in lithographic processes used to manufacture the IC product according to the IC design layout 112. The OPC 170 (or model-based OPC) is a lithography enhancement technique used to compensate for image errors, such as those that can arise from diffraction, interference, or other process effects. The RET 160 and OPC 170 features, such as scattering bars, serif, and/or hammerheads, are added to the IC design layout 112 according to optical models or rules such that, after a lithography process, a. The mask data preparation 122 can include further resolution enhancement techniques, such as off-axis illumination, sub-resolution assist features, phase-shifting masks, other suitable techniques, or combinations thereof.

The OPC 170 accounts for distortion in the pattern transfer process with modification of the design shapes in order to print the desired images on the wafer. The OPC 170 may include general modifications for the limitation in the lithography process, and in one particular example accounts for the case of optical lithography. The OPC 170 may include modifications of the design image account for optical limitations as well as mask fabrication limitations and resist limitations. Modifications of the design image can also account for the subsequent process steps like dry etching or implantation. It can also account for flare in the optical system as well as pattern density variations. Another application of proximity effect correction is the compensation of the effects of aberrations of the optical system used to print the image of the mask onto the wafers.

The FRAC 180 performs a fracturing process on the RET-processed and OPC-processed IC design layout (which may also be referred to as a modified IC design layout) to convert to a writer format (e.g., e-beam format). The fracturing process is performed on the data files to "fracture" the design features into polygons or other structures suitable for mask production. In one embodiment, the fracturing process creates temporary files, which are individual files created by individual machines that are batched to the host machine for merging. The process may further include merging the temporary files into a single file and converting the single file into a flat poly format. The flat poly format is a format used by an electronic design and analysis (EDA) tool, for example, a Synopsys® tool. At mask tooling 124, a "write-file" process converts data from the fracture process (a flat poly format) into a unique file format used by different writers, for example, a vsb12 format of Toshiba Corporation.

Data preparation may further include other processes, including but not limited to various pre-OPC and post-OPC processes. In one example, post-OPC processes include but are not limited to a lithographic process check (LPC) that simulates processing that will be implemented by the IC manufacturer 130 to fabricate the IC device 140, and various quality assurance processes (e.g., difference region alignment quality assurance and LPC check of boundary regions, XOR, CRC). LPC may simulate this processing based on the modified IC design layout to create a simulated manufactured device, such as the IC device 140. The simulated manufactured device may be all or a portion of the IC design layout. In the present embodiment, the LPC may simulate processing of the modified IC design layout, which has been subjected to the LOP 150, RET 160, OPC 170, and FRAC 180.

LPC may determine whether the simulated manufactured device violates any of the plurality of hot spot rules. If the simulated manufactured device satisfies the hot spot rules, the mask data preparation may be completed, and the IC design layout 112, more particularly, the modified IC design layout undergoes further processing in the mask tooling 124. Alternatively, the modified IC design layout is subjected to further model-based testing, rule-based testing, and/or otherwise modified or tested to further improve the design and/or layout of the device before the manufacturing phase.

After mask data preparation 122 and mask tooling 124, a mask or group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

During the manufacturing stage, the IC manufacturer 130, such as a semiconductor foundry, uses the masks fabricated by the mask house 120 to fabricate the IC device 140. The IC manufacturer 130 may be an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 140.

The semiconductor wafer may include a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes.

Figure 2:
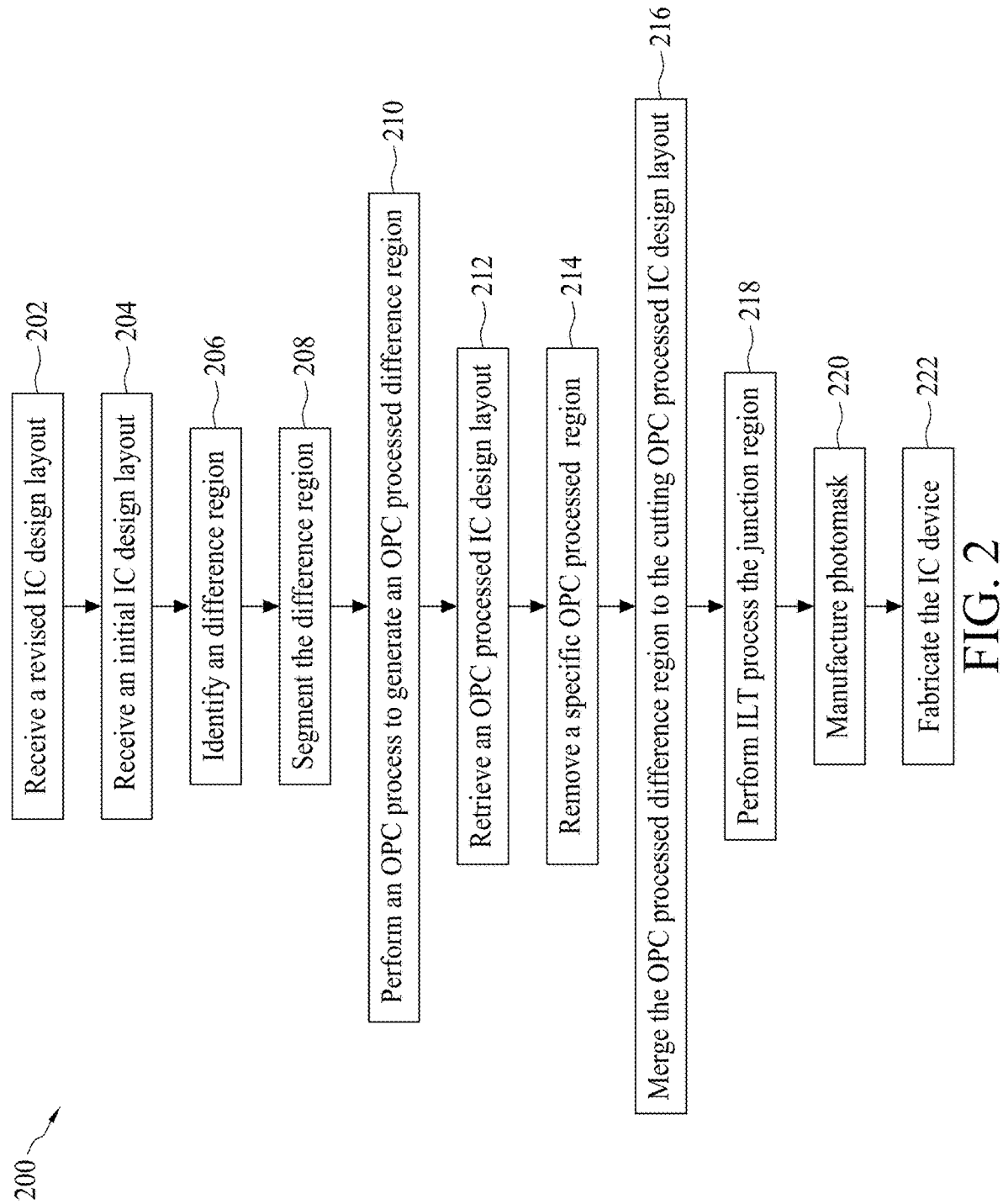
FIG. 2 is a flowchart illustrating a method of generating an IC in accordance with some embodiments.

FIG. 2 is a flowchart illustrating a method 200 of generating an IC in accordance with some embodiments. The operations 202-222 in method 200 may reduce the cycle time in IC mask data preparation in the mask house 120 when the mask house 120 receives a revised IC design layout. The revised IC design layout may be a revised version of an initial IC design layout that its masks were previously manufactured by the mask house 120. Therefore, the mask data and the related data files of the initial IC design layout may be stored in the mask house 120. According to some embodiments, the operations 202-218 of the method 200 may be carried out by a processor or a computer system in the mask house 120. However, this is not a limitation of the present embodiments.

Figure 3:
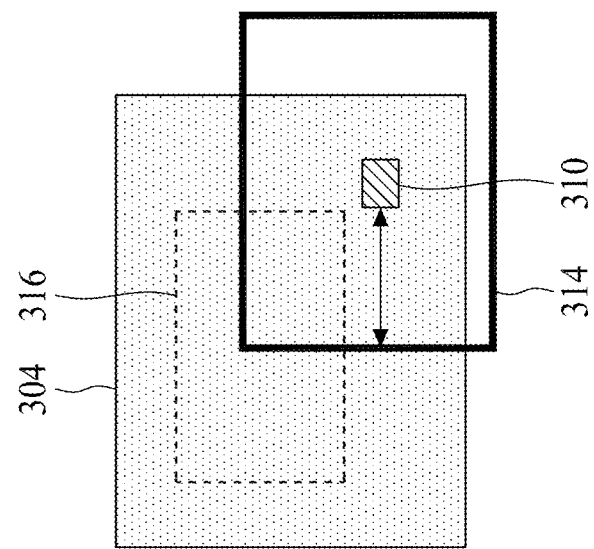
FIG. 3, which is a diagram illustrating a revised IC design layout and an initial IC design layout in accordance with some embodiments.
Figure 3:
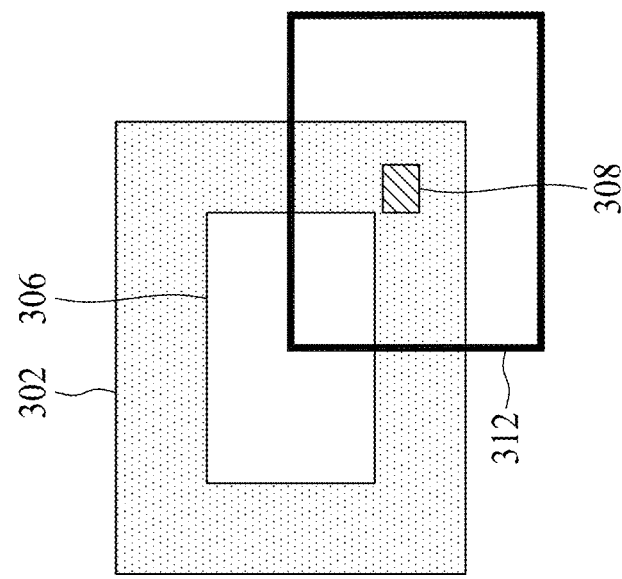

In operation 202 and FIG. 3, which is a diagram illustrating a revised IC design layout 302 and an initial IC design layout 304 in accordance with some embodiments, the revised IC design layout 302 is received by the mask house 120 from the design house 110. The revised IC design layout 302 is a re-tapeout layout of a previous layout, e.g. the initial IC design layout 304.

In operation 204 and FIG. 3, the initial IC design layout 304, which may be stored in a storage device in the mask house 120, is retrieved or read-out from a computer system in the mask house 120. According to some embodiments, the revised IC design layout 302 is not the same with the initial IC design layout 304 because the partial region 316 in the initial IC design layout 304 has been revised to be the difference region 306 in the revised IC design layout 302.

When the revised IC design layout 302 is not the same with the initial IC design layout 304, the environment of performing the OPC process in the revised IC design layout 302 may different from the environment of performing the OPC process in the initial IC design layout 304. For the example of a layout block 308 nearby the boundary of the difference region 306 in the revised IC design layout 302, the layout block 308 is not revised. Therefore, the layout block 308 is the same as the corresponding layout block 310 in the initial IC design layout 304, i.e. the layout structure, the size, and the location of the layout block 308 are the same as the layout structure, the size, and the location of the layout block 310 respectively. Although the layout block 308 and the layout block 310 are the same layout block, the OPC environment of the layout block 308 (i.e. the area surrounded by the ambit 312) may different from the OPC environment of the layout block 310 (i.e. the area surrounded by the ambit 314). This is because the OPC environment of the layout block 308 includes a portion of the revised difference region 306 and the OPC environment of the layout block 310 does not include the portion of the revised difference region 306.

According to some embodiments, the OPC process is used to compensate for layout distortions on silicon wafer that occur during the lithography. Due to the proximity effect, these layout distortions may consist of increased corner rounding, line-end shortening, and changes in linewidth when located in isolated or dense environments. For example, the proximity effect may lead to isolated layout structures larger than the densely packed layout structures. Therefore, the OPC environment of a layout block is the region to influence the proximity effect of the layout block during the OPC process. Accordingly, the dimension of the layout block 308 may different from the dimension of the layout block 310 after performing the OPC process. The different dimension between the layout block 308 and the layout block 310 may cause the conflict of dimension of mask (DOM) on the boundary of the difference region 306, which will be explained in more detailed in later paragraphs.

Figure 4B:
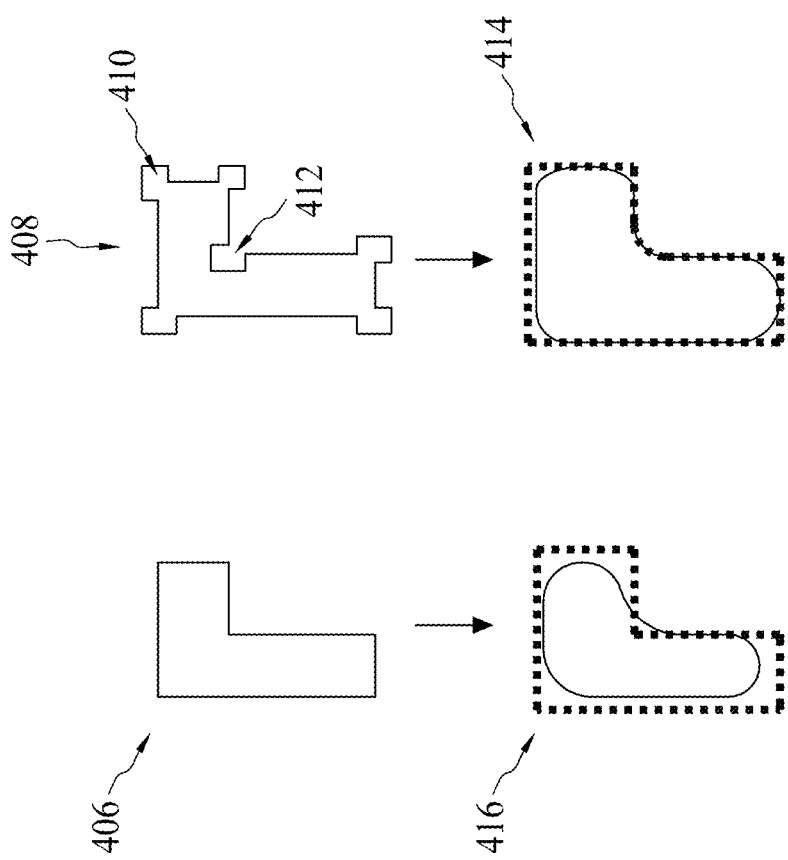
FIG. 4B is a diagram an original mask of a main feature and an OPC processed mask of the main feature in accordance with some embodiments.
Figure 4A:
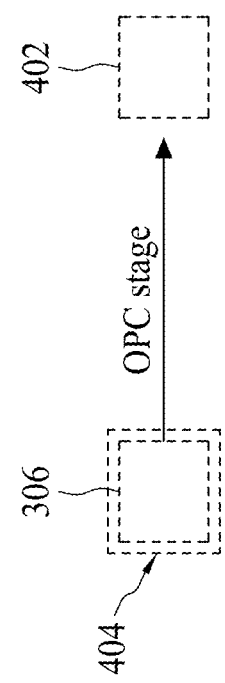
FIG. 4A, which is a diagram illustrating a difference region and an OPC processed difference region in accordance with some embodiments.

In operation 206 and FIG. 4A, which is a diagram illustrating the difference region 306 and an OPC processed difference region 402 in accordance with some embodiments, the revised IC design layout 302 is compared to the initial IC design layout 304 to identify the difference region 306 or a revised region in the revised IC design layout 302 that is different from the initial IC design layout 304. According to some embodiments, the difference region 306 is identified by performing an exclusive-or (XOR) operation upon the revised IC design layout 302 and the initial IC design layout 304. In addition, the difference region 306 of the revised IC design layout 302 may include a boundary patch 404 that includes portions of the initial IC design layout 304 to avoid gaps when merging the OPC-processed difference region (i.e. 402). In other words, difference region 306 may be larger than the difference determined by the XOR operation by the boundary patch 404 around the difference.

In operation 208 and FIG. 4A, the difference region 306 is segmented from the revised IC design layout 302.

In operation 210 and FIG. 4A, an optical proximity correcting (OPC) process is performed upon the difference region 306 to generate an OPC processed difference region 402. The OPC processing to the difference region 306 can be applied using a rule-based approach or a model-based approach. For a rule-based approach (Rule-based OPC), the displacement of the segments in the difference region 306 would be set by a list of rules depending, for example, on the feature size and its environment. For a model-based approach (Model-based OPC), the printed image on the wafer would be simulated using a model of the pattern transfer process. The correction would be set such that the simulated image matches the desired wafer image. A combination of rule-based OPC and model-based OPC sometimes referred to as hybrid OPC can also be used.

In one example, the image quality can be improved by adding printing or non-printing assist features along the edges of the main features. These assist features modify the diffraction spectrum of the pattern in a way that improves the printing of the main feature. The practical implementation of assist features is enhanced with the use of proximity effect correction as described above to correct for any optical printing artifact as well as resist and etch artifacts. FIG. 4B is a diagram an original mask 406 of a main feature and an OPC processed mask 408 of the main feature in accordance with some embodiments. By adding the printing assist features (e.g. 410) and non-printing assist features (e.g. 412) on the mask 408, the final pattern 414 on the wafer is improved with enhanced resolution and precision in comparison to the pattern 416 of the original mask 406.

Figure 5:
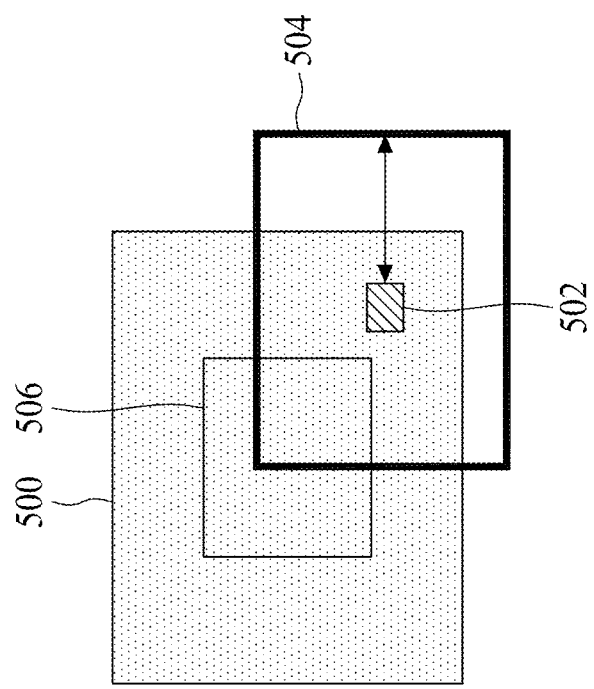
FIG. 5, which is a diagram illustrating an OPC processed IC design layout in accordance with some embodiments.

In operation 212 and FIG. 5, which is a diagram illustrating an OPC processed IC design layout 500 in accordance with some embodiments, the OPC processed IC design layout 500 corresponding to the initial IC design layout 304 is retrieved. More specifically, the OPC processed IC design layout 500 is the OPC processed layout of the initial IC design layout 304. As the initial IC design layout 304 were previously manufactured by the mask house 120, an OPC process may have performed upon the initial IC design layout 304 in the mask house 120. Thus, the OPC processed IC design layout 500 corresponding to the initial IC design layout 304 may be stored in the storage device of the mask house 120 before the revised IC design layout 302 is received by the mask house 120. Therefore, instead of performing the OPC process upon the whole revised IC design layout 302 again, the OPC processed IC design layout 500 may be re-used in this operation to save the processing time of OPC process.

In operation 212, a specific OPC processed region 506 in the OPC processed IC design layout 500 is to be replaced with the OPC processed difference region 402 for generating the OPC processed layout of the revised IC design layout 302. More specifically, the specific OPC processed region 402 is the OPC processed layout of the difference region 306 in the revised IC design layout 302, and the specific OPC processed region 506 is the OPC processed layout of the partial region 316 in the initial IC design layout 304, in which the specific OPC processed region 402 is formed in the operation 210, and the specific OPC processed region 506 was previously formed by the mask house 120 during the OPC processing of the initial IC design layout 304. According to some embodiments, the location of the specific OPC processed region 506 on the OPC processed IC design layout 500 is the same with the location of the difference region 306 on the revised IC design layout 302. For example, the coordinates of the specific OPC processed region 506 on the OPC processed IC design layout 500 may be the same with the coordinate of the difference region 306 on the revised IC design layout 302. Therefore, the location of the specific OPC processed region 506 on the OPC processed IC design layout 500 may be identified by using the location of the difference region 306 on the revised IC design layout 302 that is determined in the operation 206.

For brevity, an OPC processed layout block 502 corresponding to the layout block 310 in the initial IC design layout 304 and the corresponding OPC ambit 504 are also shown in FIG. 5.

Figure 6:
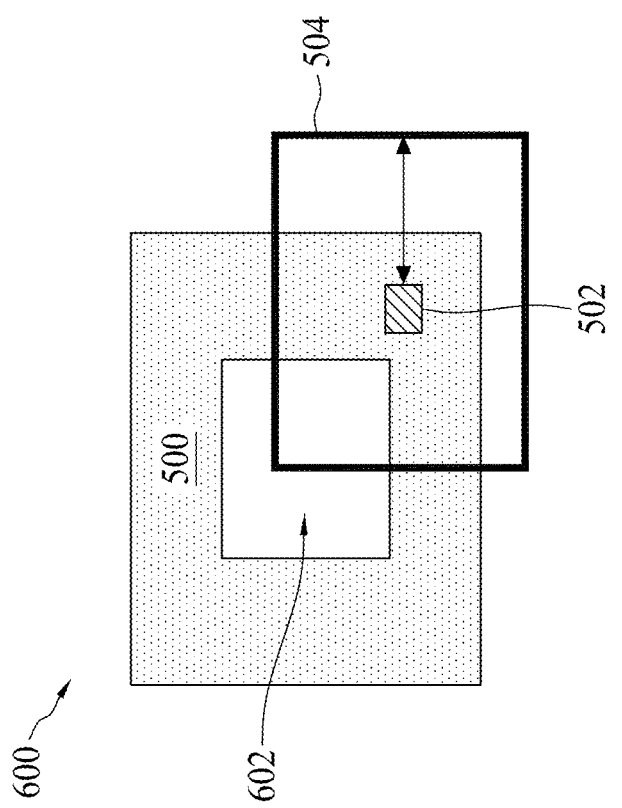
FIG. 6, which is a diagram illustrating a cutting OPC processed IC design layout in accordance with some embodiments.

In operation 214 and FIG. 6, which is a diagram illustrating a cutting OPC processed IC design layout 600 in accordance with some embodiments, the specific OPC processed region 506 in the OPC processed IC design layout 500 is removed to form an empty region 602 in the cutting OPC processed IC design layout 600.

Figure 7:
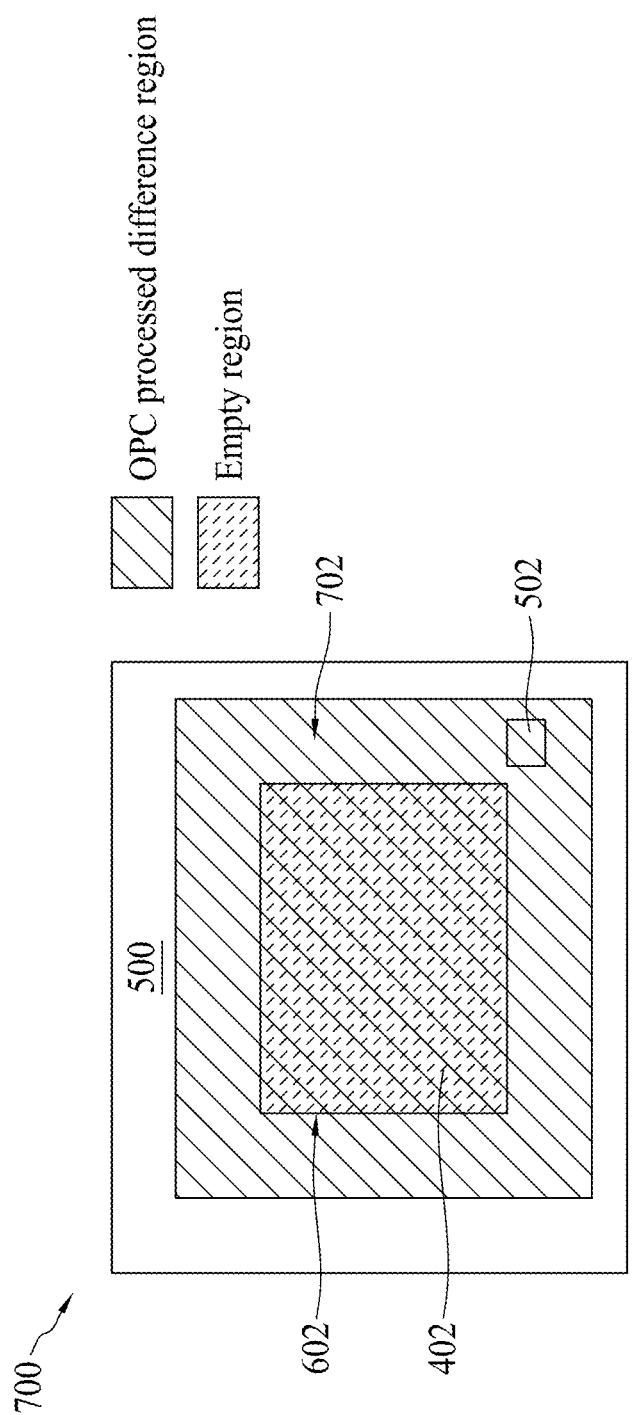
FIG. 7, which is a diagram illustrating a revised OPC processed IC design layout in accordance with some embodiments.

In operation 216 and FIG. 7, which is a diagram illustrating a revised OPC processed IC design layout 700 in accordance with some embodiments, the OPC processed difference region 402 is disposed or merged on the empty region 602 of the cutting OPC processed IC design layout 600 to form the revised OPC processed IC design layout 700. As mentioned in the operation 206, the difference region 306 may larger than the difference determined by the XOR operation by the boundary patch 404 around the difference, thus the size of the OPC processed difference region 402 may also larger than the size of the empty region 602 such that the peripheral portion of the OPC processed difference region 402 may cover a portion (i.e. the junction region 702 in FIG. 7) of the OPC processed IC design layout 500 nearby the empty region 602. The junction region 702 may include the OPC processed layout block 502. Please refer to FIG. 3 and FIG. 5 again, the OPC processed layout block 502 is obtained by performing the OPC process upon the layout block 310 with the ambit 314 on the initial IC design layout 304, in which the ambit 314 covers a portion of the partial region 316 in the initial IC design layout 304. When the partial region 316 is replaced with the difference region 306, the condition or environment of forming the OPC processed layout block 502 is also changed. Therefore, when the peripheral portion of the OPC processed difference region 402 covers the OPC processed layout block 502, the layout block in the peripheral portion of the OPC processed difference region 402 may not completely overlap with the original layout blocks (e.g. the OPC processed layout block 502) in the junction region 702. When the layout dimension on the peripheral portion of the OPC processed difference region 402 differs from the layout dimension on the portion of the OPC processed IC design layout 500 nearby the empty region 602, the DOM conflict may happen on the junction region 702.

Figure 8:
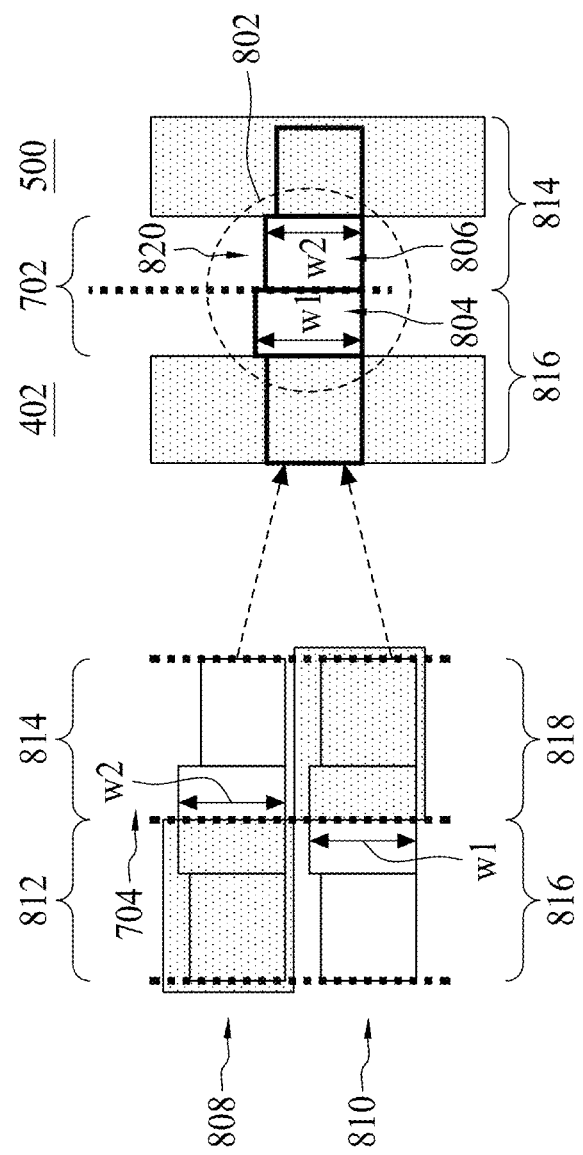
FIG. 8 is a diagram illustrating a portion on a junction region in a revised OPC processed IC design layout in accordance with some embodiments.

FIG. 8 is a diagram illustrating a portion 802 on the junction region 702 in the revised OPC processed IC design layout 700 in accordance with some embodiments. For brevity, the junction region 702 includes a portion of the OPC processed difference region 402 and a portion of the OPC processed IC design layout 500. In the junction region 702, the portion 802 comprises a first metal line layout 804 and a second metal line layout 806. The first metal line layout 804 is connected with the second metal line layout 806. However, the width w1 of the first metal line layout 804 is different from the width w2 of the second metal line layout 806. When the width w1 of the first metal line layout 804 is different from the width w2 of the second metal line layout 806, the DOM conflict may happen on the portion 802.

Specifically, the portion 802 are merged by two metal line layouts 808 and 810 as shown in the left side of FIG. 8. The metal line layout 808 is the layout portion of the OPC processed IC design layout 500. The metal line layout 810 is the layout portion of the OPC processed difference region 402. As the metal line layout 808 and the metal line layout 810 are processed under different OPC environments, the metal line layout 808 and the metal line layout 810 may have different line widths (i.e. w1 and w2) on the boundary 704. For the metal line layout 808, the layout portion 812 on the left side of the boundary 704 is removed together with the specific OPC processed region 506, and the layout portion 814 on the right side of the boundary 704 is kept. For the metal line layout 810, the layout portion 816 on the left side of the boundary 704 is kept, and the layout portion 818 on the right side of the boundary 704 is removed. Then, when the metal line layout 810 mergers with the metal line layout 808, a step 820 may form on the interface between the layout portion 816 and the layout portion 814 due to the different widths w1 and w2. The step 820 may cause DOM conflict during the mask fabricating process.

In operation 218, an inverse lithography technology (ILT) process is performed upon the junction region 702 of the revised OPC processed IC design layout 700. The ILT process is applied to obtain a mask for smoothing the step 820 on the junction region 702 such that the contour of the conductive line matches the target contour after fabrication. Specifically, the ILT process is a process to mathematically derive optimal photomask shapes corresponding to a particular light source and circuit pattern shape for producing desired features on a wafer.

According to some embodiments, the ILT process merely perform upon the junction region 702 of the revised OPC processed IC design layout 700 and does not perform upon the OPC processed difference region 402 and the OPC processed IC design layout 500 for saving the computer execution time.

The ILT is a technology of using curvilinear features for mask lithography. However, the ideal mask shapes may not writeable because of the unmanageable mask writing times. To manage the mask writing times, a process called Manhattan optimization may be applied to "Manhattanize" the mask to create mask patterns that may be written using only rectangular variable shaped beam shots. According to some embodiments, in the operation 218, to prepare the mask pattern of the junction region 702, the Manhattan optimization is also performed upon the junction region 702 in the operation 218. In Manhattan optimization, the updated mask is based on the gradient calculated from cost function definition. The movement of each edge in the junction region 702 follows the direction suggested by average gradient on the circuit pattern shape. Moreover, the Manhattan optimization may not generate extra edges on the updated mask.

Figure 9:
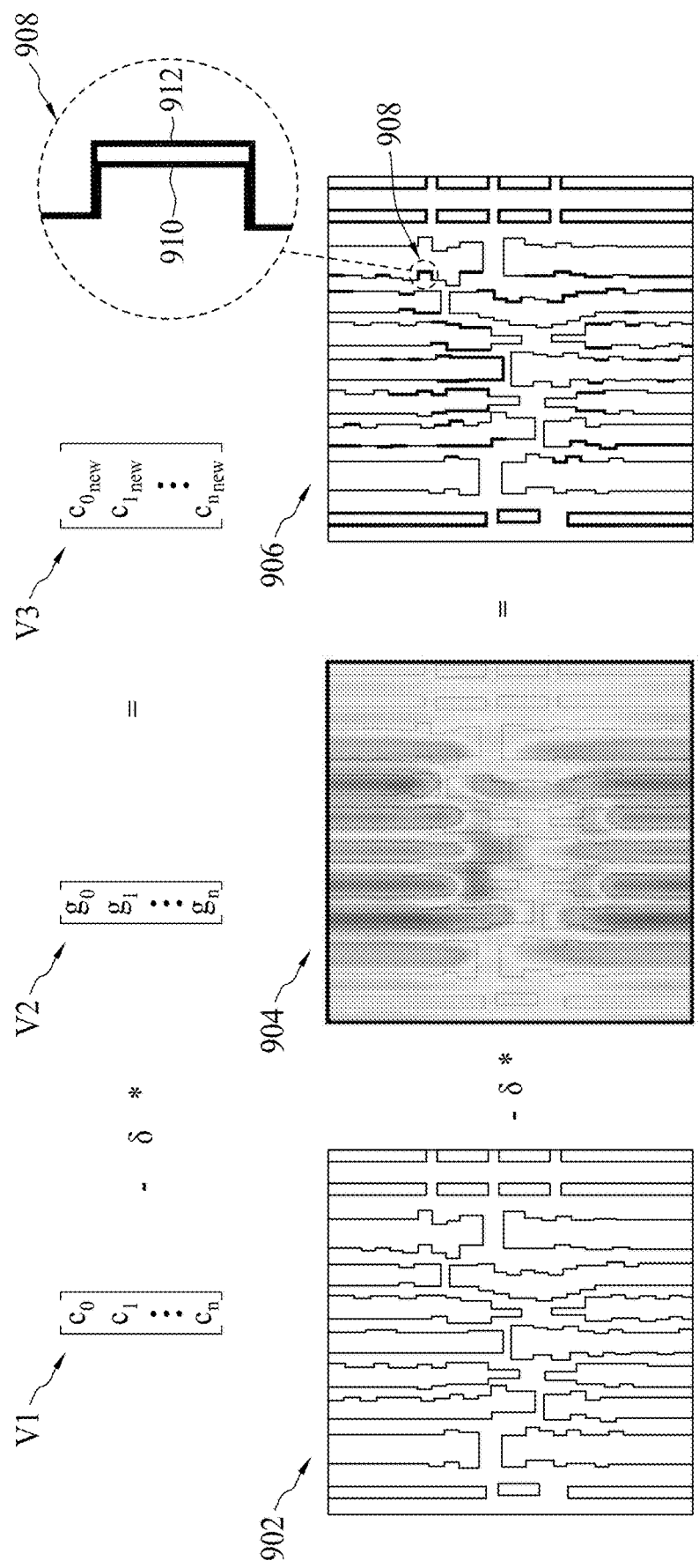
FIG. 9 is a diagram illustrating a Manhattan optimization in accordance with some embodiments.

FIG. 9 is a diagram illustrating the Manhattan optimization in accordance with some embodiments. The Manhattan optimization is performed upon a circuit pattern. For brevity, the corresponding mask of the circuit pattern is also shown in FIG. 9, in which the initial mask 902 is the mask prior to the Manhattan optimization, the gradient field 904 shows the gradient variation of the initial mask 902, and the updated mask 906 is the mask after performed by the Manhattan optimization. During the Manhattan optimization, the vector V1 (i.e. $[c_0, c_1, \ldots, c_n]$) of the segments/edges, the vector V2 (i.e. $[g_0, g_1, \ldots, g_n]$) of samples of gradient on each segment/edge, and the step length $\delta$ of the circuit pattern are extracted. Then, the vector V2 multiplied with the step length $\delta$ is subtracted from the vector V1 to obtain the vector V3 (i.e. $[c_{0new}, c_{1new}, \ldots, c_{nnew}]$) of the updated/new mask with segments/edges moved. For example, as shown in the portion 908 in FIG. 9, the edge 912 is modified to be the edge 910 after the Manhattan optimization.

After the operation 218, the mask data of the revised OPC processed IC design layout 700 is obtained in the mask house 120.

In operation 220, a photomask corresponding to the revised OPC processed IC design layout 700 is manufactured in the mask tooling 124 of the mask house 120 according to the mask data.

In operation 222, the IC device corresponding to the revised IC design layout 302 may be fabricated by the IC manufacturer 130 according to the photomask.

Figure 10:
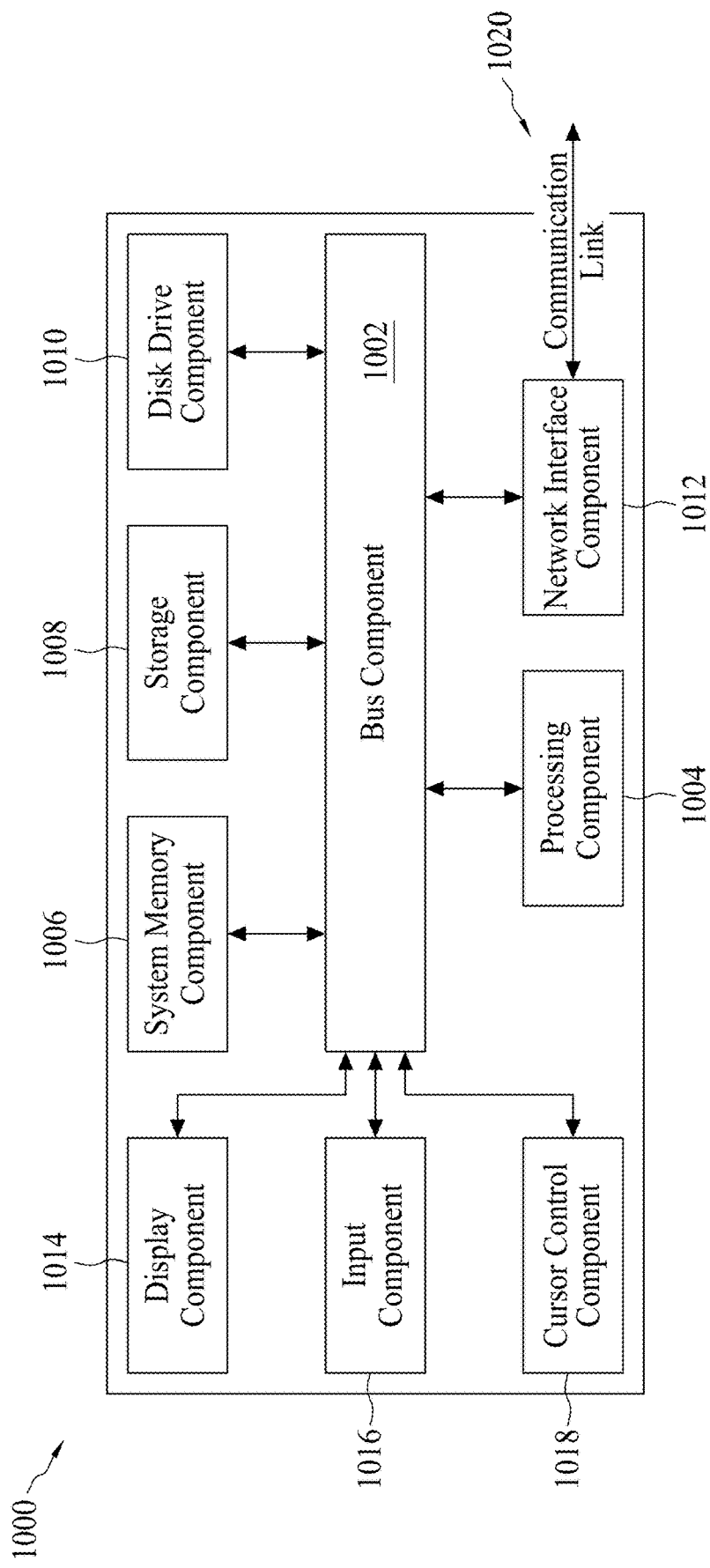
FIG. 10 is a diagram illustrating a computer system for implementing operations of the method in FIG. 2 in accordance with some embodiments.

FIG. 10 is a diagram illustrating a computer system 1000 for implementing the operations 202-218 of the method 200 in accordance with some embodiments. According to some embodiments, the computer system 1000, such as a data preparation computer and/or masking tool, includes a bus 1002 or other communication mechanism for communicating information, which interconnects subsystems and components, such as processing component 1004 (e.g., processor, micro-controller, digital signal processor (DSP), etc.), system memory component 1006 (e.g., RAM), static storage component 1008 (e.g., ROM), disk drive component 1010 (e.g., magnetic or optical), network interface component 1012 (e.g., modem or Ethernet card), display component 1014 (e.g., CRT or LCD), input component 1016 (e.g., keyboard, touch screen), and cursor control component 1018 (e.g., mouse or trackball). In one implementation, disk drive component 1010 may comprise a database having one or more disk drive components.

According to some embodiments, the computer system 1000 performs specific operations (e.g. the operations 202-218) by processor 1004 executing one or more sequences of one or more instructions contained in system memory component 1006. Such instructions may be read into system memory component 1006 from another non-transitory computer readable medium, such as static storage component 1008 or disk drive component 1010. In other embodiments, hard-wired circuitry may be used in place of or in combination with software instructions to implement the present disclosure. In one example, processor 1004 is configured to receive and access initial IC design layout data, receive and access revised IC design layout data, identify difference regions between the initial and revised IC design layout data, perform OPC on the difference region, merge OPC-processed difference regions, perform fracturing processes, perform ILT process, and/or perform Manhattan optimization. Processor 1004 is further configured to receive instructions from other components of computer system 1000 (e.g., even from a network through network interface component 1012).

Logic may be encoded in a computer readable medium, which may refer to any medium that participates in providing instructions to processor 1004 for execution. Such a medium may take many forms, including but not limited to, non-volatile media, volatile media, and transmission media. In various implementations, non-volatile media includes optical or magnetic disks, such as disk drive component 1010, volatile media includes dynamic memory, such as system memory component 1006, and transmission media includes coaxial cables, copper wire, and fiber optics, including wires that comprise bus 1002. In one example, transmission media may take the form of acoustic or light waves, such as those generated during radio wave and infrared data communications.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice embodiments of the present disclosure may be performed by computer system 1000. In various other embodiments of the present disclosure, a plurality of computer systems 1000 coupled by communication link 1020 (e.g., a communications network, such as a LAN, WLAN, PTSN, and/or various other wired or wireless networks, including telecommunications, mobile, and cellular phone networks) may perform instruction sequences to practice the present disclosure in coordination with one another.

Computer system 1000 may transmit and receive messages, data, information and instructions, including one or more programs (i.e., application code) through communication link 1020 and communication interface 1012. Received program code may be executed by processor 1004 as received and/or stored in disk drive component 1010 or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Briefly, to reduce the time required for performing data preparation associated with a mask design, the OPC processing is performed over the revised region instead of the entire layout or chip area. When the DOM of OPC processing is more complicated in advance technology nodes, the ILT process is applied to perform on the junction region between the revised region and the initial region to repair the DOM conflict such that the time-saving OPC processing may be applied to the advance technology nodes.

In some embodiments, the present disclosure provides a method of generating an integrated circuit (IC). The method comprises: receiving, by a processor, a first IC design layout; replacing, by the processor, a specific region in the first IC design layout with a first difference region; performing, by the processor, an inverse lithography technology (ILT) process upon a junction region between the first difference region and the first IC design layout to generate a mask data; and causing the IC to be fabricated according to the mask data.

In some embodiments, the present disclosure provides a method of generating an IC. The method comprises: receiving, by a processor, a first IC design layout; comparing, by the processor, the first IC design layout with a second IC design layout to identify a difference region; performing, by the processor, an OPC process upon the difference region to form an OPC processed difference region; merging, by the processor, the OPC processed difference region with an OPC processed IC design layout; performing, by the processor, an ILT process upon a first line of the OPC processed difference region and a second line of the OPC processed IC design layout to generate a mask data; and causing the IC to be fabricated according to the mask data.

In some embodiments, the present disclosure provides a non-transitory computer-readable medium having instructions embodied thereon, the instructions executable by a processor to perform a method. The method comprises: receiving a first IC design layout; replacing a specific region in the first IC design layout with a first difference region; and performing an ILT process upon a junction region between the first difference region and the first IC design layout to generate a mask data. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an integrated circuit (IC), the method comprising:
   receiving, by a processor, a first IC design layout;
   replacing, by the processor, a specific region in the first IC design layout with a first difference region;
   performing, by the processor, an inverse lithography technology (ILT) process upon a junction region between the first difference region and the first IC design layout to generate a mask data; and
   causing the IC to be fabricated according to the mask data.

2. The method of claim 1, further comprising:
   receiving, by the processor, a second IC design layout;
   comparing, by the processor, the second IC design layout to a third IC design layout to identify a second difference region of the second IC design layout that is different from the third IC design layout;
   segmenting, by the processor, the second difference region from the second IC design layout; and
   performing, by the processor, an optical proximity correcting (OPC) process upon the second difference region to generate the first difference region.

3. The method of claim 2, wherein the first IC design layout is an OPC processed IC design layout of the third IC design layout.

4. The method of claim 2, wherein replacing the specific region in the first IC design layout with the first difference region comprises:
   identifying, by the processor, a first location of the specific region in the first IC design layout according to a second location of the second difference region of the second IC design layout;
   removing, by the processor, the specific region in the first IC design layout to generate an empty region in the first location of the first IC design layout; and placing, by the processor, the first difference region into the empty region of the first IC design layout.

5. The method of claim 4, wherein the first location of the specific region on the first IC design layout is the same with the second location of the second difference region on the second IC design layout.

6. The method of claim 1, wherein performing ILT process upon the junction region between the first difference region and the first IC design layout to generate the mask data comprises:
identifying, by the processor, a first line of the first difference region and a second line of the first IC design layout in the junction region;
determining, by the processor, if a dimension of mask (DOM) conflict occurs by comparing, by the processor, a first width on the first line and a second width on the second line;
performing, by the processor, the ILT process upon the first line and the second line to generate the mask data of the junction region.

7. The method of claim 6, wherein when the first width is different from the second width, the dimension of mask conflict occurs.

8. The method of claim 6, wherein the first line of the first difference region is connected with the second line of the first IC design layout in the junction region.

9. A method of generating an integrated circuit (IC), the method comprising:
receiving, by a processor, a first IC design layout;
comparing, by the processor, the first IC design layout with a second IC design layout to identify a difference region;
performing, by the processor, an OPC process upon the difference region to form an OPC processed difference region;
merging, by the processor, the OPC processed difference region with an OPC processed IC design layout;
performing, by the processor, an inverse lithography technology (ILT) process upon a first line of the OPC processed difference region and a second line of the OPC processed IC design layout to generate a mask data; and
causing the IC to be fabricated according to the mask data.

10. The method of claim 9, wherein performing the inverse lithography technology (ILT) process upon the first line of the OPC processed difference region and the second line of the OPC processed IC design layout to generate the mask data comprises:
determining, by the processor, if a dimension of mask (DOM) conflict occurs by comparing, by the processor, a first width on the first line and a second width on the second line; and
performing, by the processor, the ILT process upon the first line and the second line to generate the mask data when the dimension of mask conflict occurs.

11. The method of claim 10, wherein when the first width is different from the second width, the dimension of mask conflict occurs.

12. The method of claim 10, wherein the first line of the OPC processed difference region is connected with the second line of the OPC processed IC design layout.

13. A non-transitory computer-readable medium having instructions embodied thereon, the instructions executable by a processor to perform a method comprising:
receiving a first IC design layout;
replacing a specific region in the first IC design layout with a first difference region; and
performing an inverse lithography technology (ILT) process upon a junction region between the first difference region and the first IC design layout to generate a mask data.

14. The non-transitory computer-readable medium of claim 13, further comprising:
receiving a second IC design layout;
comparing the second IC design layout to a third IC design layout to identify a second difference region of the second IC design layout that is different from the third IC design layout;
segmenting the second difference region from the second IC design layout; and
performing an optical proximity correcting (OPC) process upon the second difference region to generate the first difference region.

15. The non-transitory computer-readable medium of claim 14, wherein the first IC design layout is an OPC processed IC design layout of the third IC design layout.

16. The non-transitory computer-readable medium of claim 14, wherein replacing the specific region in the first IC design layout with the first difference region comprises:
identifying a first location of the specific region in the first IC design layout according to a second location of the second difference region of the second IC design layout;
removing the specific region in the first IC design layout to generate an empty region in the first location of the first IC design layout; and
placing the first difference region into the empty region of the first IC design layout.

17. The non-transitory computer-readable medium of claim 16, wherein the first location of the specific region on the first IC design layout is the same with the second location of the second difference region on the second IC design layout.

18. The non-transitory computer-readable medium of claim 13, wherein performing ILT process upon the junction region between the first difference region and the first IC design layout to generate the mask data comprises:
identifying a first line of the first difference region and a second line of the first IC design layout in the junction region;
determining if a dimension of mask (DOM) conflict occurs by comparing a first width on the first line and a second width on the second line; and
performing the ILT process upon the first line and the second line to generate the mask data when the dimension of mask conflict occurs.

19. The non-transitory computer-readable medium of claim 18, wherein when the first width is different from the second width, the dimension of mask conflict occurs.

20. The non-transitory computer-readable medium of claim 18, wherein the first line of the first difference region is connected with the second line of the first IC design layout in the junction region.

* * * * *